United States Patent [19]
Saito

[11] Patent Number: 5,814,867
[45] Date of Patent: *Sep. 29, 1998

[54] SEMICONDUCTOR DEVICE AND FABRICATION METHOD THEREOF

[75] Inventor: Satoshi Saito, Hiroshima, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 548,197

[22] Filed: Oct. 25, 1995

[30] Foreign Application Priority Data

Apr. 14, 1995 [JP] Japan ............................. 7-089356

[51] Int. Cl.$^6$ ............................. H01L 29/78; H01L 29/76
[52] U.S. Cl. ...................... 257/379; 257/359; 257/364; 257/368; 257/380; 257/903
[58] Field of Search .................................. 257/359, 364, 257/368, 379, 380, 903

[56] References Cited

U.S. PATENT DOCUMENTS

| | | | |
|---|---|---|---|
| 5,382,807 | 1/1995 | Tsutsumi et al. | 257/69 |
| 5,404,326 | 4/1995 | Okamoto | 365/156 |
| 5,489,790 | 2/1996 | Lage | 257/351 |

*Primary Examiner*—Valencia Wallace
*Attorney, Agent, or Firm*—Nixon & Vanderhye, P.C.

[57] ABSTRACT

A semiconductor device includes a pair of transistors each having an active region defined on a surface of a semiconductor substrate, a gate insulation film formed on the active region, a gate electrode formed on the gate insulation film, and a diffusion layer formed in the active region of the semiconductor substrate, one of the transistors having an opening formed by removing part of the gate insulation film on the active region, through which opening the diffusion layer is directly connected to the gate electrode of the other transistor, an end portion of the gate electrode intersecting the outer periphery of the opening at at least one point on the diffusion layer.

10 Claims, 10 Drawing Sheets

SEMICONDUCTOR DEVICE AND FABRICATION METHOD THEREOF

BACKGROUND OF THE INVENTION

1. Field of the Invention

The present invention relates to a semiconductor device and fabrication method thereof and, more particularly, to a semiconductor device having a buried contact at which a diffusion layer and gate electrode formed on a surface of a semiconductor substrate are directly interconnected.

2. Description of the Prior Art

An equivalent circuit of a typical static RAM (hereinafter referred to as "SRAM") is shown in FIG. 14, in which a pair of driving MOS transistors T1 and T2 each have a source/drain region connected to the gate of the counterpart driving MOS transistor at connection points C1 and C2, and further connected to a source/drain region of one of a pair of MOS transistors T3 and T4.

The construction of the SRAM is schematically illustrated in FIG. 15. As shown, one source/drain region of the MOS transistor T3 is directly connected to a gate electrode 47b of the driving MOS transistor T2 at the connection point C1 of an active region 40a to form a buried contact.

A fabrication method of a semiconductor device having such a construction will be described with reference to FIGS. 16 to 20 which are sectional views taken along the line II—II' of FIG. 15.

As shown in FIG. 16, active regions 40a and 40b are defined by forming an LOCOS film 42 on a silicon substrate 41. A gate insulation film 43 is then formed over the entire surface of the silicon substrate 41, and an about 500 521-thick polysilicon film 44 is formed thereon. The polysilicon film 44 which is called "mask polysilicon" serves to prevent degradation in reliability and withstand voltage of the gate insulation film which would otherwise be caused by contamination of the gate insulation film when a resist to be used to form an opening for a contact is removed in a later process.

In turn, as shown in FIG. 17, the entire surface of the polysilicon film 44 is coated with a resist film, which is then patterned into a desired configuration by a photolithographic process to form a resist pattern 46. Using the resist pattern 46 as a mask, the polysilicon film 44 is etched. After the resist is removed, the gate insulation film 43 is etched by using the polysilicon film 44 as a mask to expose a region 45 of the surface of the silicon substrate 41 in which the buried contact C1 is to be formed.

Subsequently, as shown in FIG. 18, an oxide film (not shown) naturally formed on the exposed silicon substrate 41 is removed by wet etching. A polysilicon film 47 as a gate electrode material is formed over the polysilicon film 44 and buried contact formation region 45 of the silicon substrate 41. Phosphorus impurity is diffused into the polysilicon film 47 in a common diffusion furnace by using $POCl_3$ and $O_2$. As a result, the polysilicon films 47 and 44 are doped with the impurity, which is further diffused into the buried contact C1 through the polysilicon film 47. Thus, an $N^+$ diffusion layer 48 is formed.

In turn, as shown in FIG. 19, the entire surface of the polysilicon film 47 is coated with a resist film, which is patterned into a desired configuration by a photolithographic process to form a resist pattern 49.

Finally, as shown in FIG. 20, using the resist pattern 49 as a mask, the polysilicon films 47 and 44 are patterned into desired configurations to form gate electrodes 47a and 47b. Since the polysilicon film 47 directly contacts the silicon substrate 41 at the buried contact C1, part of the silicon substrate 41 is over-etched upon the patterning of the polysilicon film 47 and, hence, a trench 50 is formed in the $N^+$ diffusion layer 48. Thereafter, by using the gate electrodes 47a and 47b as a mask, source/drain regions (not shown) are formed.

In the aforesaid process, the substrate and the gate electrodes are, in general, laid out so as to have a large contact area to minimize the contact resistance at the buried contact. Specifically, as shown in FIG. 21, a relatively large area is taken for the buried contact C1 to allow an end of the gate electrode 47b to be located therein. Therefore, the active region 40a uncovered with the LOCOS film is over-etched when the polysilicon film is patterned to form the gate electrode 47b, resulting in the formation of the trench 50, as shown in FIG. 22 which is a sectional view taken along the line III—III' of FIG. 21 and as shown in FIG. 23 which is a sectional view taken along the line IV—IV' of FIG. 21. The trench 50 is unavoidably formed since it has a depth greater than the film thickness of the polysilicon film 44 serving basically as a mask silicon.

Methods for preventing the formation of the trench are proposed, for example, in Japanese Unexamined Patent Publications No. 4-219975 (1992) and No. 4-313239 (1992).

Japanese Unexamined Patent Publication No. 4-313239 discloses a method for controlling the angle of impurity implantation to implant an impurity even to the bottom of a trench, thereby preventing line disconnection and the increase in contact resistance due to the trench.

Japanese Unexamined Patent Publication No. 4-219975 describes an art in which the etching resistance of a mask polysilicon is increased to enhance the masking effect by forming the mask polysilicon from an amorphous silicon having a tighter structure than polysilicon, thereby reducing the thickness of the mask silicon to minimize the formation of the trench.

However, the method for implanting the impurity onto the bottom of the trench disclosed in Japanese Unexamined Patent Publication No. 4-313239 requires a complicated process. In addition, a sufficient resistance cannot be obtained because the interior surface of the trench is damaged by etching. Another reason for the insufficient resistance is that the ion concentration of the diffusion layer is low since the semiconductor device is generally formed with transistors of LDD structure. On the other hand, where a high concentration diffusion layer is formed, a side-wall spacer is formed around the gate electrode and the trench is filled with the side-wall spacer, so that it is impossible to sufficiently implant the impurity onto the bottom of the trench.

The trench 50, if formed deeper than the lower side of the diffusion layer, cuts off the source/drain. Even if the trench 50 does not cause the cut-off of the diffusion layer, the diffusion layer is damaged or becomes too thin by the patterning of the gate electrode, resulting in an increase in the resistance at the buried contact C1 including the diffusion layer. It has been found that when the resistance at the buried contact C1, for example, of a high resistance type SRAM becomes several KΩ, an operation failure occurs. The reduction in the thickness of the mask silicon disclosed in Japanese Unexamined Patent Publication No. 4-219975 can minimize the depth of the trench but, in reality, a 0.05 μm- to 0.1 μm-deep trench is formed. Therefore, it is impossible to perfectly prevent the formation of the trench.

To be more specifically described, the gate electrode on the shoulder portions of the LOCOS film has an effective film thickness greater by about 20% than that of a flat portion thereof. Where the gate electrode generally has a thickness of 3500 Å, for example, the thickness thereof on the shoulder portions of the LOCOS film is 3500 Å plus about 700 Å and further the thickness of the mask silicon, e.g., about 400 Å is added thereto, so that the total surplus thickness is about 1100 Å. Therefore, the flat portion is over-etched by about 0.11 μm when the gate electrode material is patterned into the gate electrode. It is known that where the junction depth of the diffusion layer is 0.2 μm to 0.3 μm, the over-etching of 0.1 μm results in a six-fold resistance.

Additionally, to meet the requirements for a higher speed operation of the transistors, the junction depth of the diffusion layer is required to be further reduced. More specifically, a 0.6 μm-rule LSI requires a diffusion layer junction depth of less than about 0.12 μm and a 0.35 μm-rule LSI requires a diffusion layer junction depth of less than 0.10 μm. Therefore, the requirements cannot be satisfied only by reducing the thickness of the mask silicon.

Another method of preventing the formation of the trench includes making the opening of the buried contact C1 smaller than the gate electrode. With this method, however, the impurity is not sufficiently diffused into the polysilicon substrate 41 from the polysilicon film 47 at the buried contact C1. Therefore, the source/drain regions 51 formed by ion implantation after the formation of the gate electrode 47b are not properly connected to the diffusion layer 48, resulting in the formation of offset region R.

SUMMARY OF THE INVENTION

In accordance with a first aspect of the present invention, there is provided a semiconductor device comprising a pair of transistors being formed on an active region defined on a surface of a semiconductor substrate, and each having a gate insulation film formed on the active region, a gate electrode formed on the gate insulation film and a diffusion layer formed in the active region of the semiconductor substrate, one of the transistors having an opening formed by removing part of the gate insulation film on the active region, through which opening the diffusion layer is directly connected to the gate electrode of the other transistor, an end portion of the gate electrode intersecting the outer periphery of the opening at at least one point on the diffusion layer.

In accordance with a second aspect of the present invention, there is provided a method of fabricating a semiconductor device comprising the steps of: (i) forming an active region, a gate insulation film and a silicon film on a surface of a semiconductor substrate, followed by patterning the silicon film as a mask silicon film having an opening within the active region; (ii) forming an opening in the gate insulation film by using the mask silicon film as a mask to expose the semiconductor substrate; (iii) forming a first diffusion layer just below the opening, and forming a polysilicon film on the mask silicon film including the opening; (iv) patterning the polysilicon film and the mask silicon film to form a gate electrode of an adjacent transistor such that an end portion of the gate electrode intersects the outer periphery of the opening in at least one portion of the active region and such that the gate electrode is directly connected to the semiconductor substrate through the opening; and (v) forming a second diffusion layer connected to the first diffusion layer by ion implantation using the gate electrode as a mask.

DETAILED DESCRIPTION OF THE PREFERRED EMBODIMENTS

Figure 1:
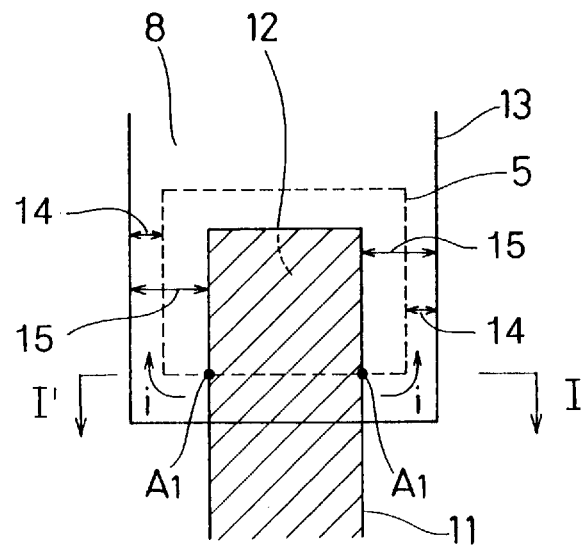
FIG. 1 is a schematic plan view illustrating a buried contact of a semiconductor device in accordance with one embodiment of the present invention.

A semiconductor device in accordance with the present invention has at least one pair of transistors which are each formed on an active region and comprise a gate insulation film, a gate electrode and a diffusion layer. A semiconductor substrate to be used for the semiconductor device of the present invention is not particularly limited, but a silicon substrate is preferably used. The active region is defined by forming an LOCOS film for a device isolation. The thickness and material of the gate insulation film formed on the active region (diffusion layer) are not particularly limited, but the gate insulation film is preferably formed of $SiO_2$ film having a thickness of about 70 Å to about 150 Å. Exemplary materials of the gate electrode include a single layer film made of polysilicon and the like, and multi-layer film such as a silicide made of polysilicon and a metal used as an electrode material, and a polycide made of the silicide and polysilicon. The thickness of the gate electrode is appropriately adjusted depending on the size and the like of a semiconductor device to be fabricated. The diffusion layer may be of P type or N type, and formed by implanting impurity ions of P type or N type into the active region of the semiconductor substrate up to a concentration of about $1\times10^{19}$ to about $1\times10^{21}$ ions/cm$^3$, or by annealing the semiconductor substrate in contact with polysilicon heavily doped with an impurity. The method for the formation of the diffusion layer is not particularly limited.

The gate insulation film formed on the active region of one of the transistors is formed with an opening which is utilized for the formation of a buried contact directly connecting the diffusion layer to the gate electrode of the adjacent transistor. The shape of the opening is not particularly limited, but the opening is formed into any of various shapes including quadrangles such as square and rectangle, and polygons obtained by modifying a quadrangle with at least one corner or side thereof being recessed, projected or cut. The size of the opening is preferably such that a portion of the active region (diffusion layer) is covered therewith, but is appropriately adjusted in consideration of the contact resistance which is determined by the contact area between the diffusion layer and the gate electrode.

In the semiconductor device of the present invention, the diffusion layer of one transistor is directly connected to the gate electrode of the other transistor through the opening formed on the diffusion layer. In this case, the end portion of the gate electrode is required to intersect the outer periphery of the opening at at least one point on the diffusion layer. As long as this requirement is satisfied, the number and locations of intersections are not particularly limited.

Under the gate electrode in a region other than the opening for the buried contact is provided a mask silicon film used as the mask when the opening is formed in the gate insulation film.

The active region, gate insulation film and silicon film are formed by known processes in the step (i) of the semiconductor device fabrication method according to the present invention. The silicon film is typically formed of polysilicon or amorphous silicon as having a thickness of about 200 Å to about 500 Å by a known process such as CVD. The silicon film thus formed is patterned into a mask silicon film having an opening in a desired region thereof by a known process such as photolithographic and etching process.

In the step (ii), an opening is formed in the gate insulation film to a depth reaching the semiconductor substrate by a known etching technique, e.g., wet-etching with hydrofluoric acid or the like or dry etching with $CF_4$, $CHF_3$ or the like by using the mask silicon as a mask.

In the step (iii), the first diffusion layer and the polysilicon film are formed successively in this order or in the reverse order, or simultaneously. More specifically, the first diffusion layer and the polysilicon film may be formed in any of the following manners: (1) the first diffusion layer is first formed by implanting impurity ions into the active region of the semiconductor substrate through the opening up to a concentration of about $1\times10^{15}$cm$^{-2}$ to about $3\times10^{15}$cm$^{-2}$, and then the polysilicon film is formed on the mask silicon film including the opening by a known process; (2) the polysilicon film is formed on the mask silicon film including the opening by a known process and, thereafter or simultaneously therewith, the impurity is doped into the polysilicon film up to a desired concentration, so that the impurity is further diffused into the active region of the semiconductor substrate from the polysilicon film through the opening to form the first diffusion layer; and (3) the polysilicon film is formed on the mask silicon film including the opening by a known process and, thereafter or simultaneously therewith, the impurity is diffused into the polysilicon film up to a desired concentration, and then an annealing is performed, for example, at a temperature of 800° C. to 900° C. for 10 min to 120 min to allow the impurity to further diffuse into the active region of the semiconductor substrate from the polysilicon film through the opening to form the first diffusion layer.

In the step (iv), the gate electrode is formed by patterning the mask silicon film and the polysilicon film by a known process so that an end portion of the gate electrode thus formed intersects the outer periphery of the opening at at least one point on the diffusion layer. Thus, the gate electrode directly connected to the first diffusion layer is formed.

In the step (v), the second diffusion layer connected to the first diffusion layer is formed by implanting ions, for example, in a concentration of $1\times10^{13}$cm$^{-2}$ to $9\times10^{13}$cm$^{-2}$ with use of the gate electrode as a mask. The ion implantation is performed by a known process. After the formation of the second diffusion layer, an insulation film is formed on the gate electrode, and then etched by a known method, e.g., RIE method for the formation of a side-wall spacer around the gate electrode. Using the gate electrode formed with the side-wall spacer as a mask, ion implantation is performed again to form a diffusion layer having an LDD structure.

With reference to the attached drawings, the semiconductor device and the method for fabricating the semiconductor device according to the present invention will hereinafter be described by way of examples thereof.

EXAMPLE 1

(Semiconductor device)

Figure 2:
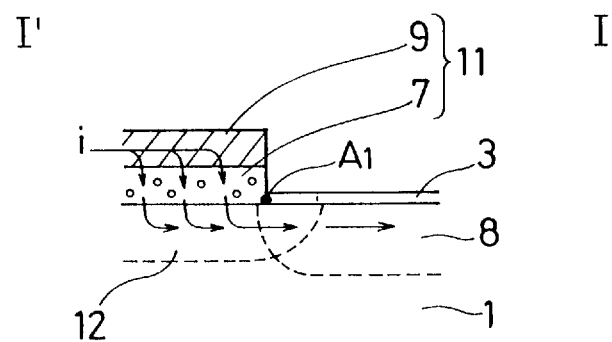
FIG. 2 is a schematic sectional view taken along the line I—I' of FIG. 1.

One exemplary semiconductor device of the present invention is shown in FIGS. 1 and 2. Diffusion layers 8 and 12 are formed in an active region 13 defined on a surface of a semiconductor substrate 1. On the diffusion layer 8 is formed a gate insulation film 3. The gate insulation film has an opening 5 on a portion of the active region 13, and a gate electrode 11 of a polysilicon film 7 and WSi film 9 is formed on a region extending from a device isolation region to the opening 5. In the opening 5, a buried contact is formed at which the diffusion layer 12 is directly connected to the gate electrode 11. Under the gate electrode 11 in a region other than the opening 5 is provided a mask silicon film (not shown). At a point $A_1$, an end portion of the gate electrode 11 intersects the outer periphery of the opening 5 on the active region 13 of the semiconductor substrate 1 formed with the diffusion layers 8 and 12.

In FIG. 1, a two-fold overlapped portion has a design margin of 0.2 $\mu$m and three-fold overlapped portion has a design margin of 0.3 $\mu$m as indicated at 14 and 15, respectively. Where the gate electrode 11 is laid out so that the end portion thereof intersects the outer periphery of the opening on the active region 13 in consideration of the design margins as shown in FIG. 1, a trench is not formed in the semiconductor substrate 1 at the intersection $A_1$ no matter how much the active region 13 and the opening 5 are offset from predetermined positions. Therefore, the diffusion layer 8 can be assuredly joined with the diffusion layer 12 as shown in FIG. 2, allowing electric current applied to the gate electrode 11 to flow to the diffusion layers 8 and 12 in a direction indicated by the arrow i in FIGS. 1 and 2. Thus, line disconnection and a considerable increase in the contact resistance will not occur in this region.

EXAMPLE 2

(Fabrication method of semiconductor device)

Figure 3:
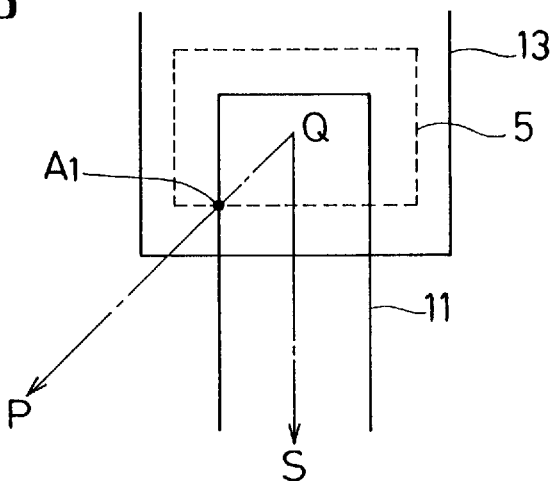
FIGS. 3 to 6 are schematic plan views for illustrating a fabrication process of the semiconductor device shown in FIG. 1.

A method for fabricating the semiconductor device of Example 1 will be described with reference to FIGS. 4 to 6 which are sectional views taken along the lines P-Q-S in the plan view of FIG. 3.

Figure 4:
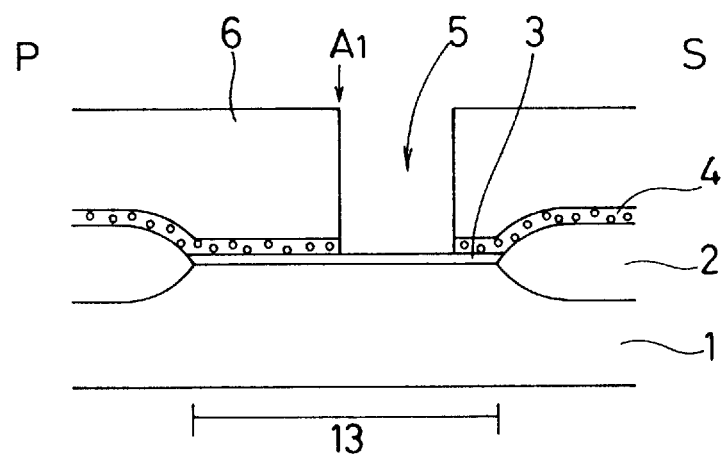

As shown in FIG. 4, a field oxide film 2 for device isolation is formed in a desired region of the semiconductor substrate 1 to define the active region 13. In turn, a gate insulation film 3 is formed on the active region 13. Thereafter, a first polysilicon film 4 as a mask silicon film is deposited to a thickness of about 500 Å on the entire surfaces of the field oxidation film 2 and the gate insulation film 3 by a CVD process at 625° C. A resist is applied on the entire surface of the first polysilicon film 4, and a resist pattern 6 having an opening in a desired region is formed by an ordinary photolithographic process. In turn, the opening 5 is formed in the first polysilicon film 4 by using the resist pattern 6 as a mask. The formation of the opening 5 is achieved by an ordinary dry etching technique. More specifically, only the first polysilicon film 4 is etched in the following conditions: $Cl_2/O_2=75$ sccm/5 sccm, etching energy=80 W, selective etching ratio of the first polysilicon film 4 to the gate insulation film 3=about 30. Thereafter, the resist pattern 6 is removed.

Figure 5:
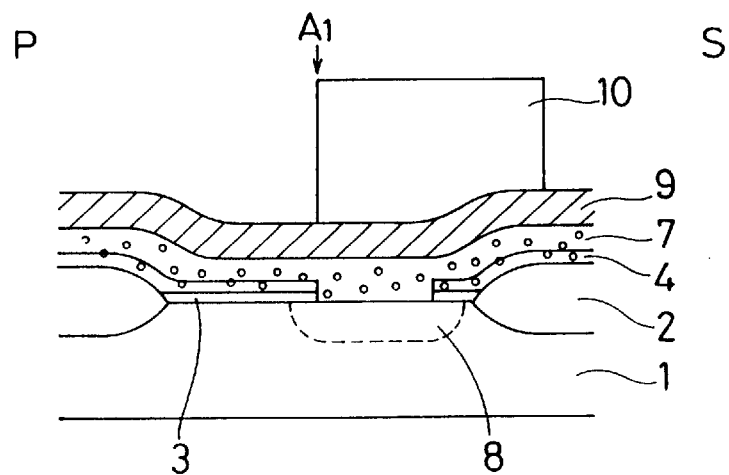

As shown in FIG. 5, the gate insulation film 3 is chemically etched, for example, for about 5 min to about 10 min by 1% hydrofluoric acid, by using the first polysilicon film 4 as a mask. Thus, a surface of the semiconductor substrate 1 is exposed.

Within several hours thereafter, a second polysilicon film 7 is formed to a thickness of about 1000 Å by a CVD process in substantially the same manner as the formation of the first polysilicon film 4, except that the deposition temperature is 850° C. and the deposition time is 10 min. In turn, the semiconductor substrate 1 is introduced into an ordinary diffusion furnace, in which impurity ions are diffused into the second polysilicon film 7 and the first polysilicon film 4 by using $POCl_3$ and $O_2$, and the substrate is annealed for 35 min in an atmosphere of nitrogen. Thus, the impurity ions are diffused into the second polysilicon film 7 and the first polysilicon film 4, and further diffused from the second polysilicon film 7 into the semiconductor substrate 1 directly contacting the second polysilicon film 7, whereby an $N^+$ diffusion layer 8 is formed around the opening 5. In turn, a WSix (tungsten silicide) film 9 is deposited on the entire surface of the second polysilicon film 7 to a thickness of about 2000 Å. Then, the WSix film 9 is coated with a resist, which in turn is patterned into a resist pattern 10 having a desired pattern configuration by an ordinary photolithographic process.

Figure 6:
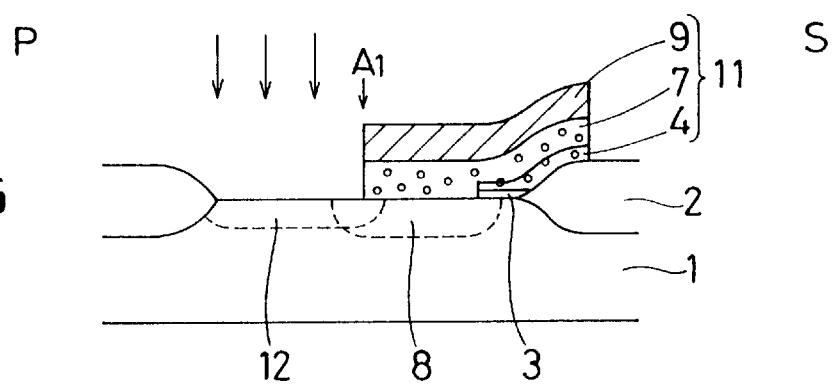

As shown in FIG. 6, the gate electrode 11 is formed by dry-etching the WSix film 9, the second polysilicon film 7, the first polysilicon film 4 and the gate insulation film 3 with use of the resist pattern 10 as a mask. The conditions for the etching are the same as those for the etching of the first polysilicon film 4. At this time, the surface of the semiconductor substrate 1 is not etched, because the end portion of the gate electrode 11 overlaps the outer periphery of the opening 5 at the point $A_1$.

Further, the $N^-$ diffusion layer 12 for LDD is formed by implanting phosphorus, for example, in a dose of $2\times10^{13}$ ions/cm² with use of the gate electrode 11 as a mask.

EXAMPLE 3
(Fabrication method of semiconductor device)

An explanation will be given to another fabrication method of a semiconductor device.

Figure 7:
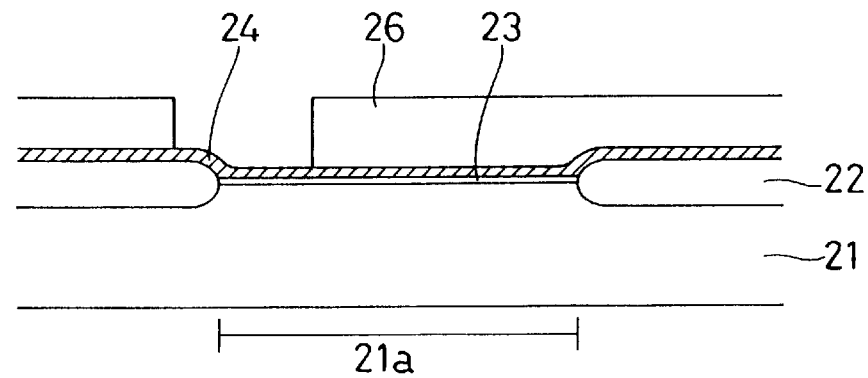
FIGS. 7 to 10 are schematic sectional views for explaining another fabrication process of a semiconductor device in accordance with the present invention.

As shown in FIG. 7, a field oxide film 22 for device isolation is formed in a desired region of a semiconductor substrate 21 to define an active region 21a and a gate insulation film 23 is formed in the same manner as Example 2. Thereafter, a first polysilicon film 24 is formed in the same manner as Example 2, and an opening is formed in the first polysilicon film 24 by using a resist pattern 26 having an opening in a desired region.

Figure 8:
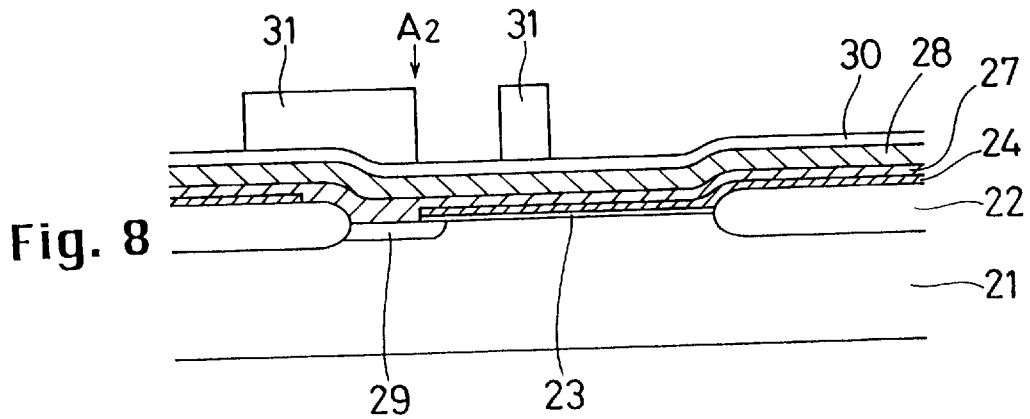

As shown in FIG. 8, the gate insulation film 23 is etched by using the first polysilicon film 24 as a mask to form an opening in which the surface of the semiconductor substrate 21 is exposed.

In turn, a second polysilicon film 27 is formed on the entire surface of the first polysilicon 24 including the opening in the same manner as Example 2, and a diffusion layer 29 is formed in the semiconductor substrate 21 by impurity doping and annealing.

Further, WSix film 28 and $SiO_2$ film 30 are successively formed on the entire surface of the second polysilicon film 27, and a resist pattern 31 having a desired pattern configuration is formed on the $SiO_2$ film 30.

Figure 9:
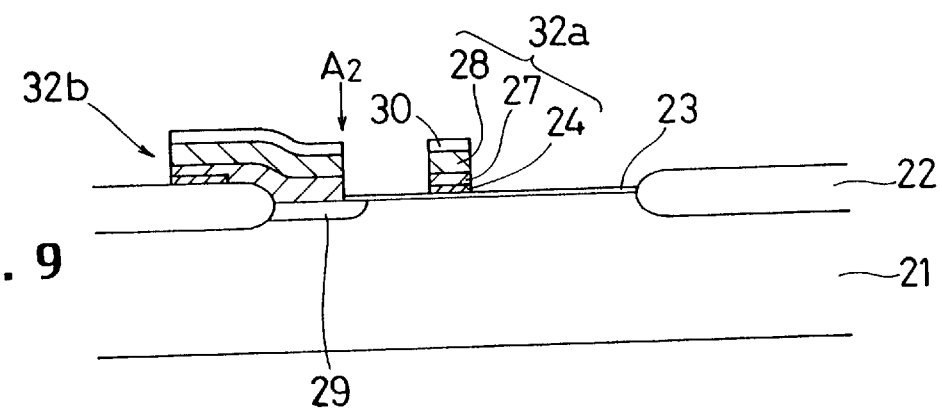

As shown in FIG. 9, the $SiO_2$ film 30, the WSix film 28, the second polysilicon film 27, the first polysilicon film 24 and the gate insulation film 23 are successively etched by the RIE method to form gate electrodes 32a and 32b. At this time, the surface of the semiconductor substrate 21 is not etched, because the end portion of the gate electrode 32b overlaps the outer periphery of the opening at a point $A_2$.

Figure 10:
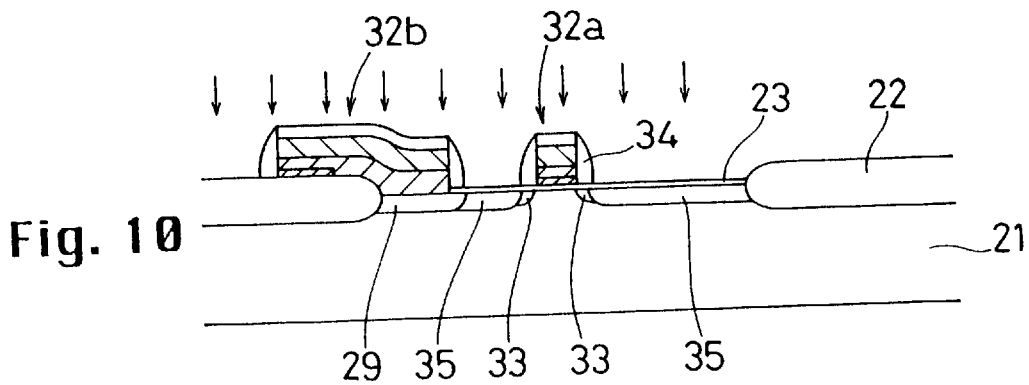

As shown in FIG. 10, an $N^-$ diffusion layer 33 of LDD is formed in self-alignment with the gate electrode 32a and 32b by lightly doping the semiconductor substrate 21 with use of the gate electrodes 32a and 32b as a mask. Further, after an $SiO_2$ film is formed on the entire surface of the semiconductor substrate 21 including the gate electrodes 32a and 32b, side-wall spacers 34 are formed around the gate electrodes 32a and 32b by vertically etching the surface of the semiconductor substrate 21, for example, by the RIE method. Then, an $N^+$ diffusion layer 35 is formed by implanting As ions into the semiconductor substrate with use of the gate electrodes 32a and 32b and the side-wall spacer 34 as a mask.

EXAMPLES 4 TO 6
(Semiconductor devices)

Figure 11:
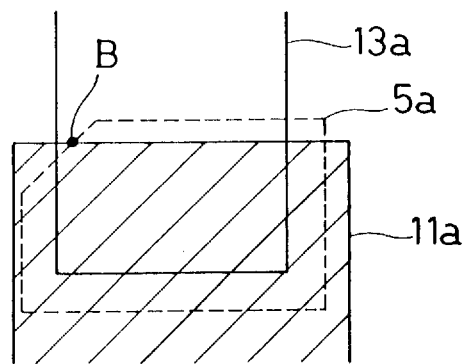
FIG. 11 is a schematic plan view illustrating major portions of a semiconductor device in accordance with another embodiment of the present invention.

Though the semiconductor device according to Example 1 has a smaller contact area at the buried contact than a conventional semiconductor device, a semiconductor device according to Example 4 as shown in FIG. 11 has a sufficient contact area while having an end portion of a gate electrode 11 intersecting the periphery of the opening 5a on an active region 13a by shaping the opening 5a into a configuration such that one corner of a rectangle is cut. Therefore, the semiconductor substrate does not have a trench at a point B, so that the diffusion layers can assuredly join each other under the gate electrode 11a. This allows electric current applied to the gate electrode 11a to flow to the diffusion layers without remarkably increasing the contact resistance.

Figure 12:
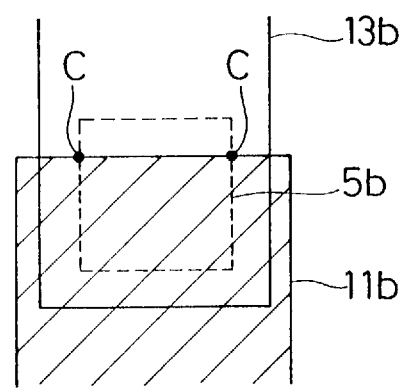
FIG. 12 is a schematic plan view illustrating major portions of a semiconductor device in accordance with yet another embodiment of the present invention.
Figure 13:
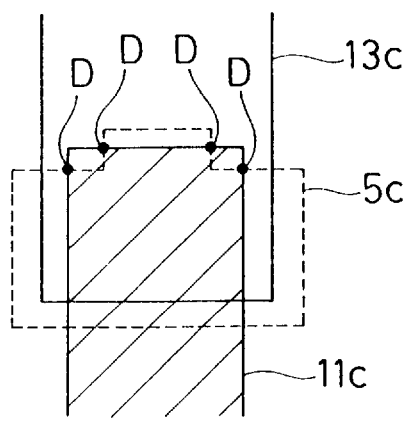
FIG. 13 is a schematic plan view illustrating major portions of a semiconductor device in accordance with still another embodiment of the present invention.
Figure 14:
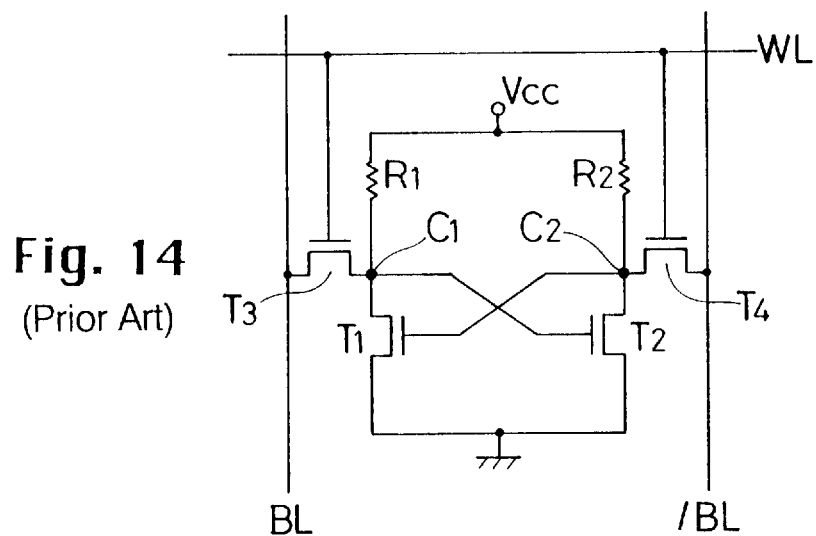
FIG. 14 is an equivalent circuit diagram of a typical SRAM.
Figure 15:
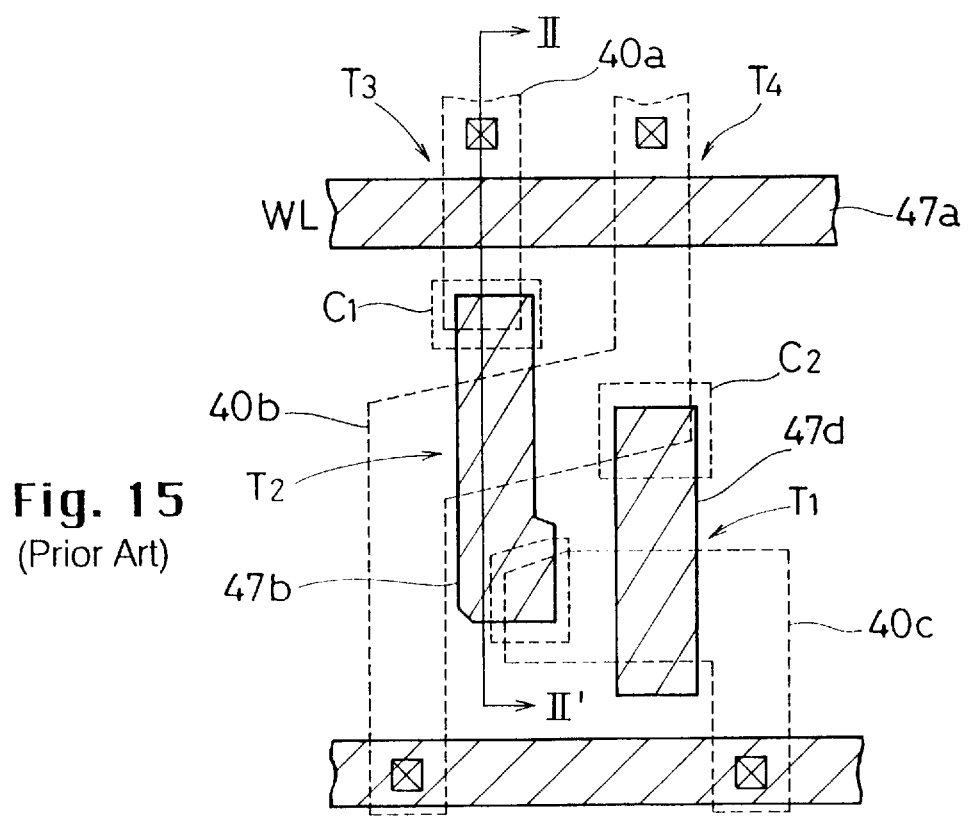
FIG. 15 is a schematic plan view illustrating major portions of the SRAM shown in FIG. 14.
Figure 16:
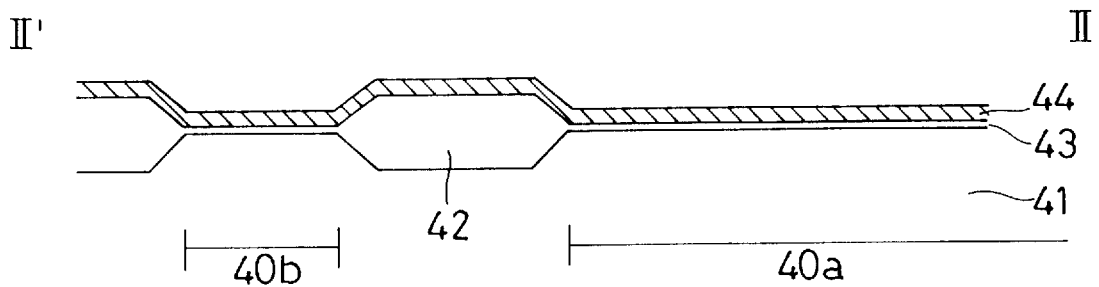
FIGS. 16 to 20 are schematic sectional views taken along the line II—II' of FIG. 15 for explaining a fabrication process of the semiconductor device shown in FIG. 15.
Figure 17:
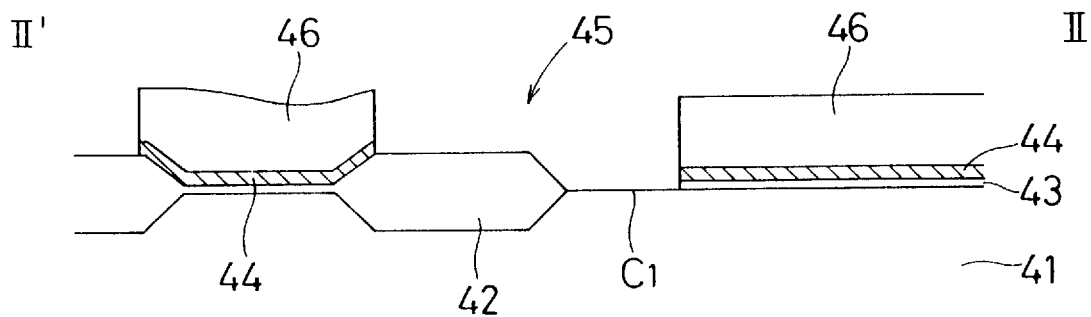
Figure 18:
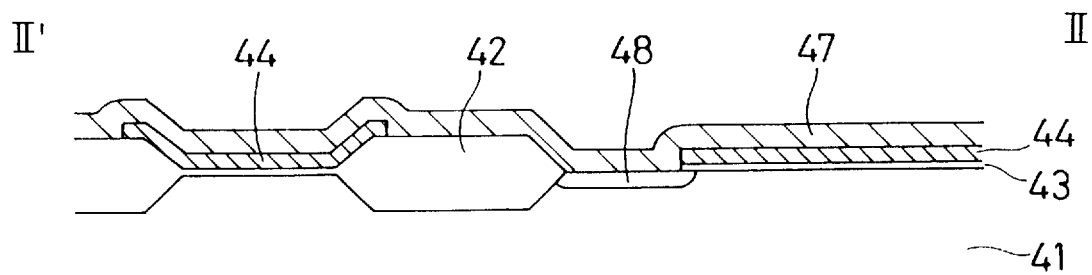
Figure 19:
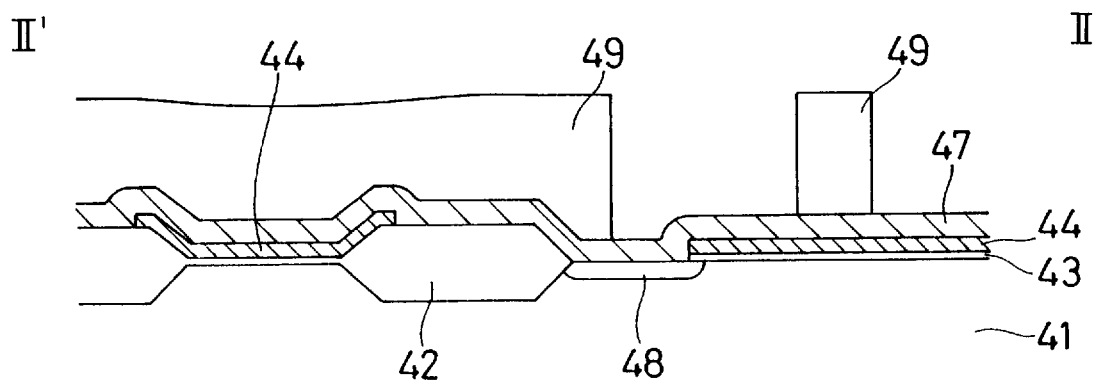
Figure 20:
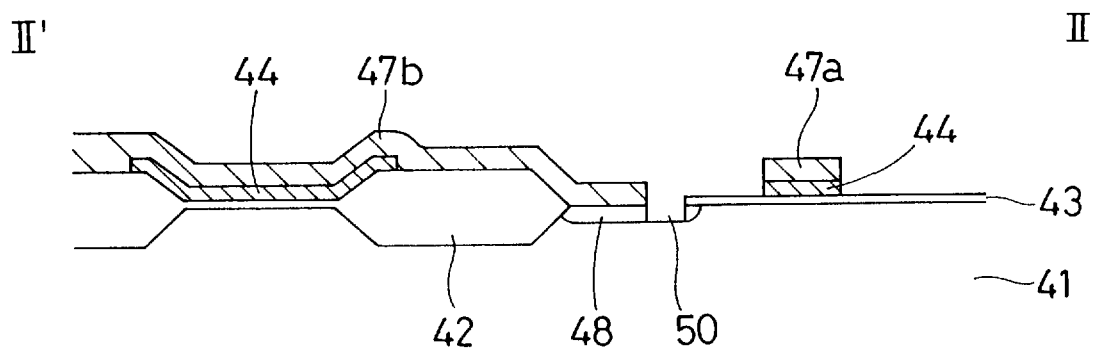
Figure 21:
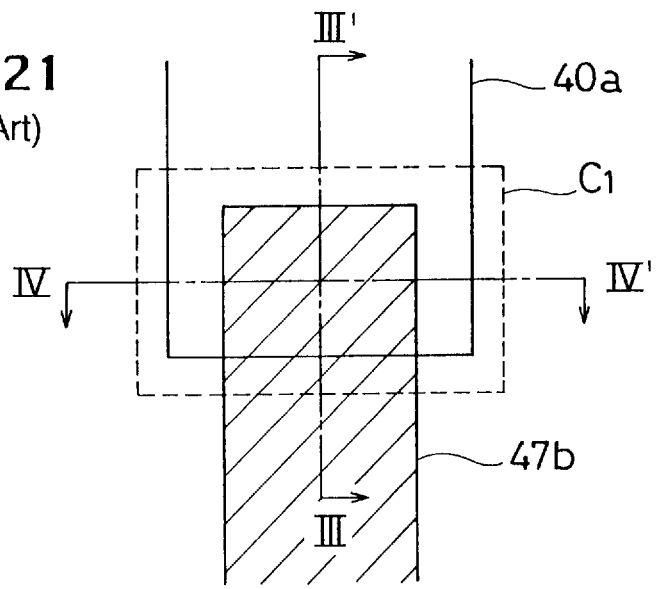
FIG. 21 is a schematic sectional view illustrating major portions of another conventional semiconductor device.
Figure 22:
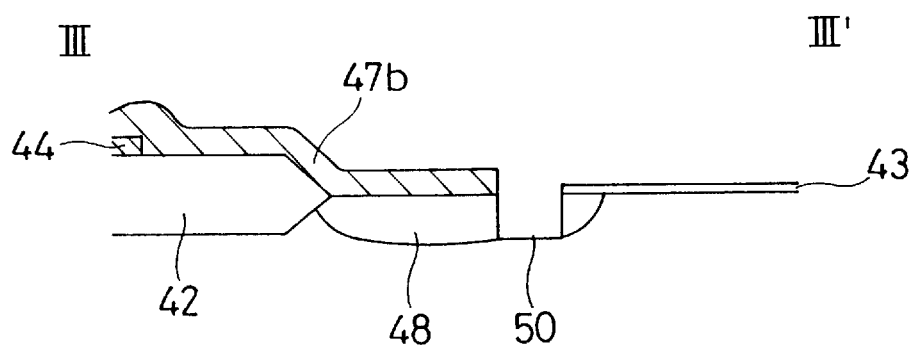
FIG. 22 is a schematic sectional view taken along the line III—III' of FIG. 21.
Figure 23:
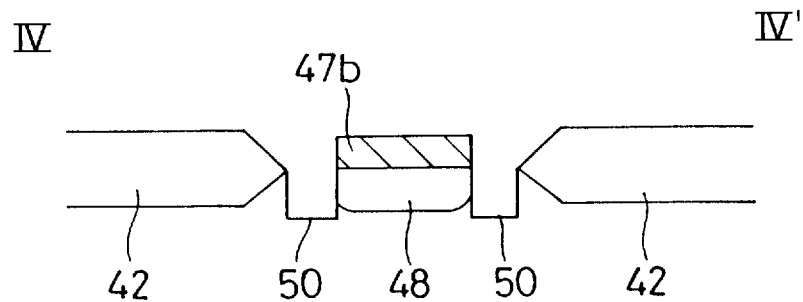
FIG. 23 is a schematic sectional view taken along the line IV—IV' of FIG. 21.
Figure 24:
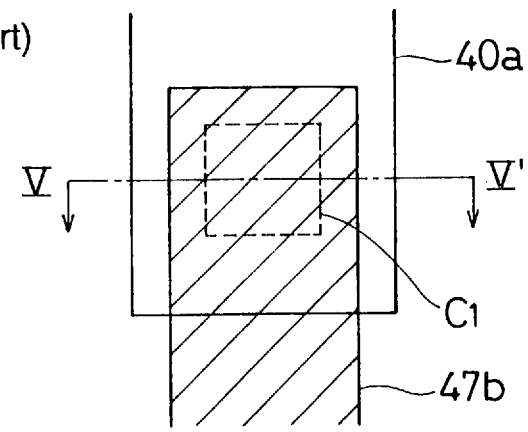
FIG. 24 is a schematic sectional view illustrating major portions of still another conventional semiconductor device.
Figure 25:
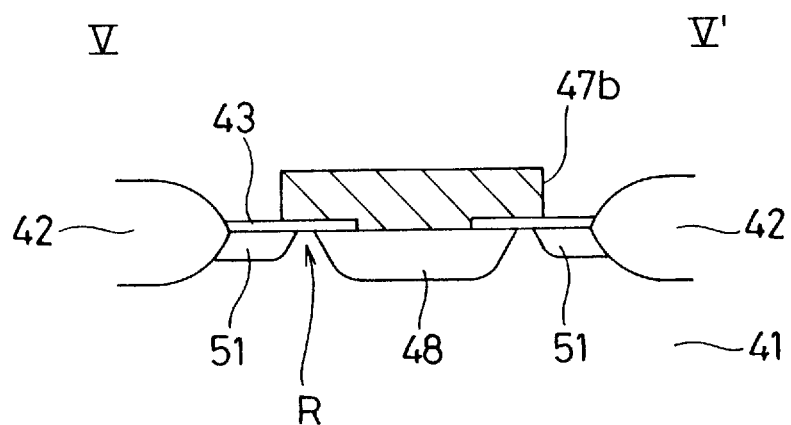
FIG. 25 is a schematic sectional view taken along the line V—V' of FIG. 24.

Various layouts such as in Examples 5 and 6 respectively shown in FIGS. 12 and 13 are possible in order to reduce areas occupied by buried contacts in the semiconductor devices where end portions of gate electrodes 11b and 11c intersect the outer peripheries of openings 5b and 5c at points C and D on active regions 13b and 13c.

In the semiconductor device in accordance with the present invention, an end portion of the gate electrode formed on the diffusion layer in the active region intersects the outer periphery of the opening at at least one point on the diffusion layer. Therefore, the formation of a trench in the vicinity of the intersection can be prevented. Even if a trench is formed in other regions of the semiconductor substrate, an offset region is not formed in the diffusion layer, thereby preventing line disconnection.

In the method for fabricating a semiconductor device in accordance with the present invention, the gate electrode is patterned so that the end portion of the gate electrode formed on the diffusion layer in the active region intersects the outer periphery of the opening at at least one point on the diffusion layer. Therefore, the over-etching of the semiconductor substrate in the vicinity of the intersection can be prevented simply by suitably specifying the position and configuration of the opening. This prevents line disconnection, and suppresses the increase in the contact resistance between the semiconductor substrate and the gate electrode. Thus, a highly-reliable high-speed semiconductor device can be fabricated which ensures a great operational margin and low power consumption.

While the present invention has been described by way of specific examples thereof, it should be understood that these examples are not limitative of the present invention and various modifications and changes may be made thereto without departing from the spirit and scope of the present invention, as defined in the appended claims.

What is claimed is:

1. A semiconductor device comprising:
    a pair of transistors being formed on an active region defined on a surface of a semiconductor substrate, and each having a gate insulation film formed on the active region, a gate electrode formed on the gate insulation film and a diffusion layer formed in the active region of the semiconductor substrate, each said gate electrode having an outer periphery,
    one of the transistors having an opening formed by removing part of the gate insulation film on the active region, through which opening the diffusion layer is directly connected to the gate electrode of the other transistor, the outer periphery of an end portion of the gate electrode of the other transistor intersecting the outer periphery of the opening at least one point on the diffusion layer.

2. A semiconductor device as set forth in claim 1,
    wherein the diffusion layer formed just below the opening has an impurity ion concentration of about $1 \times 10^{19}$ to about $1 \times 10^{21}$ ions/cm.

3. A semiconductor device as set forth in claim 1,
    wherein the diffusion layer just below the opening is formed by ion implantation and thermal ion diffusion from the gate electrode directly connected to the diffusion layer.

4. A semiconductor device according to claim 1 wherein the periphery of the end portion of the gate electrode of the other transistor intersects the outer periphery of the opening at only one point on the diffusion layer.

5. A semiconductor device according to claim 1 wherein the periphery of the end portion of the gate electrode of the other transistor intersects the outer periphery of the opening at only two points on the diffusion layer.

6. A semiconductor device according to claim 1 wherein the outer periphery of the opening includes a convex portion and wherein the periphery of the end portion of the gate electrode of the other transistor intersects the outer periphery of the opening at four points on the diffusion layer.

7. A semiconductor device comprising:
    a pair of transistors being formed on an active region defined on a surface of a semiconductor substrate, and each having a gate insulation film formed on the active region, a gate electrode formed on the gate insulation film and a diffusion layer formed in the active region of the semiconductor substrate,
    one of the transistors having an opening formed by removing part of the gate insulation film on the active region, through which opening the diffusion layer is directly connected to the gate electrode of the other transistor, a periphery of an end portion of the gate electrode of the other transistor intersecting the outer periphery of the opening at one point on the diffusion layer,
    wherein the outer periphery of the opening is partly extended outside of the active region;
    the opening has a cut-off part of the diffusion layer; and
    the gate electrode of the other transistor partly overlaps the cut-off part of the opening, thereby the periphery of the end portion of the gate electrode of the other transistor intersects the outer periphery of the opening at the cut-off part of the diffusion layer.

8. A semiconductor device according to claim 5 wherein the outer periphery of the opening is located within the active region and the outer periphery of the end portion of the gate electrode of the other transistor is partly extended outside the active region.

9. A semiconductor device comprising:
    a pair of transistors formed on an active region defined on a surface of a semiconductor substrate, and each having a gate insulation film formed on the active region, a gate electrode formed on the gate insulation film and a diffusion layer formed in the active region of the semiconductor substrate,
    one of the transistors having an opening formed by removing part of the gate insulation film on the active region, through which opening the diffusion layer is directly connected to the gate electrode of the other transistor, a periphery of an end portion of the gate electrode of the other transistor intersecting the outer periphery of the opening at four points on the diffusion layer,
    wherein the outer periphery of the opening is partly extended outside of the active region;
    the opening has a convex portion on the active region; and
    the gate electrode of the other transistor partly overlaps the convex portion of the opening, whereby the periphery of the end portion of the gate electrode of the other transistor intersects the outer periphery of the convex portion of the opening on the diffusion layer.

10. A semiconductor device according to claim 1 wherein the diffusion layer is substantially extended outside of the opening.

* * * * *